United States Patent
Collins et al.

(10) Patent No.: US 8,907,494 B2
(45) Date of Patent: Dec. 9, 2014

(54) ELECTRICAL LEAKAGE REDUCTION IN STACKED INTEGRATED CIRCUITS HAVING THROUGH-SILICON-VIA (TSV) STRUCTURES

(71) Applicant: International Business Machines Corporation, Armonk, NY (US)

(72) Inventors: Christopher N. Collins, Wappinger Falls, NY (US); Mukta G. Farooq, Hopewell Jct., NY (US); Troy L. Graves-Abe, Wappinger Falls, NY (US); Joyce C. Liu, Carmel, NY (US); Gerd Pfeiffer, Poughquag, NY (US); Thuy L. Tran-Quinn, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/826,628

(22) Filed: Mar. 14, 2013

(65) Prior Publication Data

US 2014/0264756 A1    Sep. 18, 2014

(51) Int. Cl.
*H01L 23/52* (2006.01)
*H01L 23/538* (2006.01)
*H01L 29/32* (2006.01)

(52) U.S. Cl.
CPC ............ *H01L 29/32* (2013.01); *H01L 23/5384* (2013.01)
USPC ........................................................ 257/774

(58) Field of Classification Search
CPC ........ H01L 25/065; H01L 25/10; H01L 23/52
USPC .......................................... 257/617, 774, 778
See application file for complete search history.

(56) References Cited

U.S. PATENT DOCUMENTS

| | | | |
|---|---|---|---|
| 6,222,252 B1 | 4/2001 | Numano et al. | |
| 6,428,619 B1 | 8/2002 | Koya et al. | |
| 6,805,743 B2 | 10/2004 | Kobayashi et al. | |
| 6,818,197 B2 | 11/2004 | Ikezawa et al. | |
| 7,629,054 B2 | 12/2009 | Umeno | |
| 7,837,791 B2 | 11/2010 | Murakami et al. | |
| 7,915,145 B2 | 3/2011 | Kurita et al. | |
| 8,231,725 B2 | 7/2012 | Sattler et al. | |
| 8,357,939 B2 | 1/2013 | Nakai | |
| 2002/0009862 A1 | 1/2002 | Mun | |
| 2011/0115070 A1 | 5/2011 | Lim et al. | |
| 2011/0298083 A1 | 12/2011 | Yoneda | |
| 2013/0175698 A1* | 7/2013 | Gandhi et al. | 257/774 |
| 2013/0223014 A1* | 8/2013 | Lin et al. | 361/728 |
| 2013/0228898 A1* | 9/2013 | Ide | 257/621 |
| 2013/0229847 A1* | 9/2013 | Nakanishi et al. | 365/51 |
| 2013/0249098 A1* | 9/2013 | West | 257/762 |

\* cited by examiner

*Primary Examiner* — Nathan Ha
(74) *Attorney, Agent, or Firm* — H. Daniel Schnurmann; Keivan Razavi

(57) ABSTRACT

The formation of TSVs (through substrate vias) for 3D applications has proven to be defect dependent upon the type of starting semiconductor substrate employed. In addition to the initial formation of TSVs via Bosch processing, backside 3D wafer processing has also shown a defect dependency on substrate type. High yield of TSV formation can be achieved by utilizing a substrate that embodies bulk micro defects (BMD) at a density between 1e4/cc (particles per cubic centimeter) and 1e7/cc and having equivalent diameter less than 55 nm (nanometers).

15 Claims, 1 Drawing Sheet

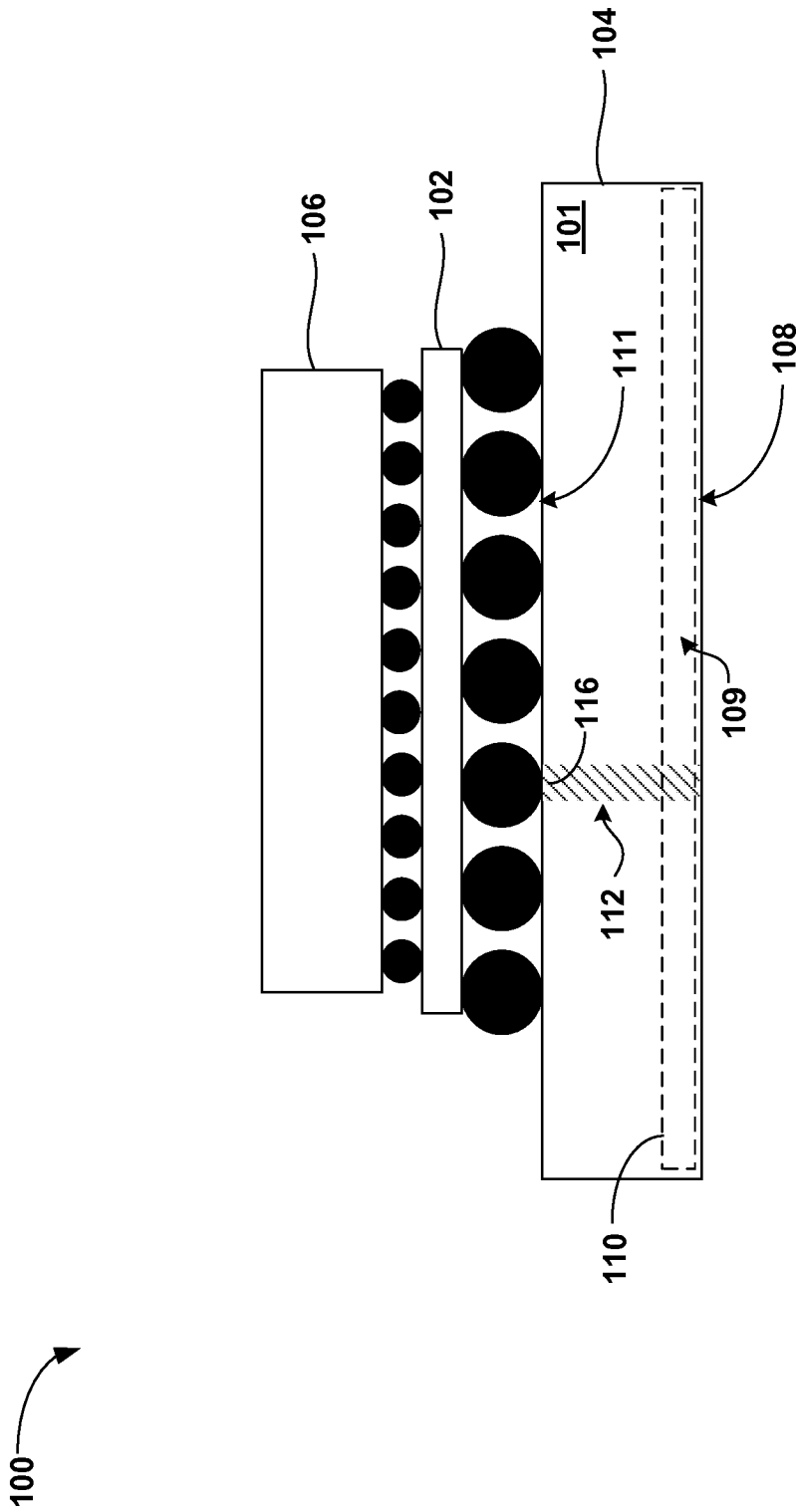

ELECTRICAL LEAKAGE REDUCTION IN STACKED INTEGRATED CIRCUITS HAVING THROUGH-SILICON-VIA (TSV) STRUCTURES

FIELD OF THE INVENTION

This invention relates generally to an integrated circuit having at least two vertically stacked semiconductor substrates, and more specifically to TSV (through substrate via) structures formed in such an integrated circuit.

BACKGROUND OF THE INVENTION

Integrated circuits have become ubiquitous. Today 'complimentary metal on semiconductor' (CMOS) technology can create billions of devices such as transistors for logic or memory (or both) on a single semiconductor substrate; which single substrate is known as a 'monolithic integrated circuit' and will be referred to herein as a chip. Hundreds of chips can be formed together as regions of a single semiconductor wafer and then diced to separate the individual chips. The devices are formed on a 'front-side' surface of a wafer by so-called 'front end of the line' processing (FEOL) of a wafer, with wafer processing typically continuing to form a contact layer (so called 'middle of the line' or MOL) and wiring to interconnect the devices of the single substrate (so-called 'back end of the line' or BEOL) before the wafer is diced.

In order to continue to improve performance and functionality of integrated circuits, the industry has recently been developing technology to vertically integrate two or more chips into a single vertically integrated component. In some embodiments, the two or more chips can each have active semiconductor devices (such as field effect transistors). In other embodiments, at least one of such two or more chips can be an 'interposer' which may not have any semiconductor devices or might only have passive semiconductor devices (such as a capacitor). Whereas the 'monolithic IC' includes a single semiconductor substrate (but could have other structural layers such as an organic laminate packaging), the single vertically integrated component is referred to herein as a three-dimensional (3D) integrated circuit (3D IC). A 3D IC includes at least two chips stacked together (and could similarly have additional layers such as a packaging laminate). Like the monolithic IC, many 3D ICs can theoretically be formed simultaneously by bonding entire (or partial) wafers and then singulating the individual 3D ICs by dicing the stack, each 3D IC having two or more chips vertically bonded together.

Whereas the device face (front-side) of a single chip IC can be directly against the packaging structure which delivers power and carries signals between the chip and the outside world, the 3D IC has at least one chip that is separated from the packaging by another chip. Power can be delivered to the devices of the at least one remote chip or devices on different chips of the same 3D IC can be interconnected using conductive elements that extend entirely through intermediate chips, referred to as 'through substrate vias' (TSVs). Put another way, a TSV is a conductive path within a 3D IC that passes through a chip and conductively connects elements located on opposite sides of that chip. A 3D IC can theoretically include any number of chips (C1, C2, ... Cx, x>=2) and a TSV can theoretically connect any one chip of the stack to any other chip of the stack or to the packaging interface by passing through the one or more chips in between (e.g., if x=4, C1 can be connected to C4 by a TSV that passes through C2 and C3).

The intermediate substrates must be thinned to enable forming TSVs. TSVs can be formed into the substrate during fabrication of the front side, for example by etching a TSV cavity into a substrate, forming an insulating layer, depositing barrier and seed layers, plating to fill the cavity (which can be achieved by bottom-up techniques to avoid forming voids in the very high aspect ratio TSV cavity), CMP (chemical mechanical planarization), and building interconnects to connect to the TSV in a subsequent BEOL level. In such a flow scheme, the back side of the substrate can subsequently be thinned to expose the remote end of the TSV. Further processing can include cleaning and passivating the grind side.

Semiconductor wafers are produced by growing a single crystalline ingot that is sliced into wafers and polished. Crystal defects, which can agglomerate to form 'crystal originated particles' (COPs), and contaminants such as oxygen and metals are inevitably incorporated in the ingot. It is known to form semiconductor devices in a region free of any COPs that have a size larger than or commensurate to the semiconductor devices. One approach is to form a "denuded zone" on the device face of a wafer. For example, US Publ. 2002/0009862 to Mun (hereafter "Mun") is directed to a two step heat treatment to remove grown-in defects to a required depth (10 to 100 um in claim 11). Another approach disclosed by U.S. Pat. No. 8,231,725 to Sattler et al is to form the crystalline ingot wafer having COP defects with a size not more than 30 nm.

Oxygen and certain other contaminants within the semiconductor ingot are not entirely undesirable since they can form so called precipitates known as 'bulk micro defects' (BMD) which can getter metal contaminants. Mun's method also purportedly forms a high density of BMD. U.S. Pat. No. 8,357,939 discloses process conditions to create a denuded zone while retaining a density of BMD above 1e11/cc at depth greater than 50 um and having an equivalent diameter within the range of 10-50 nm.

Additional metal contamination (above and beyond that incorporated during growth of the single crystalline ingot) can be introduced by thinning a wafer such as for incorporation in a 3D IC. U.S. Pat. No. 7,915,145 to Kurita et al discloses to address the additional contamination by careful CMP processing to add 'extrinsic gettering' on the grind side of a wafer having an 'intrinsic gettering' capability with BMD density in the range of 1e6 to 1e11 and size in the range of 10 to 100 nm.

Before thinning the wafer to expose the TSV, testing is performed to identify (and remove) those chips having flawed circuitry or excessive electrical leakage to the substrate. Electrical leakage can be tested by imposing a high voltage stress, known as 'time dependent dielectric breakdown' (TDDB) testing. Many TSVs appear to be structurally sound according to the front side 'post fab' testing but apparently contain latent TSV defects which can be triggered by the thinning process because they exhibit unacceptable leakage once the back side has been thinned to expose the TSV. A need remains to reduce the occurrence of such latent flaws within TSVs.

SUMMARY OF THE INVENTION

According to a first embodiment, the invention provides a semiconductor chip comprising a semiconductor substrate with a first major surface in which a semiconductor device has been formed and a second major surface opposite to said first major surface, where the second major surface is created by thinning the semiconductor substrate, and bulk micro defects (BMD) having an average size less than 55 nm (nanometers) within a region of said semiconductor substrate. The region with BMD can extend from the second major surface through the semiconductor chip or to a lesser depth just adjacent to the grind side, such as to a depth of about ten microns from the said second major surface. The semiconductor chip can include COPs and can also include a TSV.

According to a second embodiment this invention provides an integrated circuit structure that includes a first chip bonded to a second chip, where the said first chip includes a plurality of semiconductor devices, the second chip includes a front surface in which at least one semiconductor device is formed, a back surface opposite to said front surface, and a through substrate via (TSV) that extends at least from said front surface to said back surface, and the second chip has a BMD density between 1e4/cc and 1e7/cc in a region bounded by said back surface. The first substrate of the 3D IC can include BMD at a density greater than 1e9/cc.

According to another aspect, the present invention provides a 3D IC having a first chip bonded to a second chip, where the first chip includes first BMD having an average equivalent diameter greater than 70 nm in an interior region and the second chip includes second BMD having average equivalent diameter smaller than 50 nm. In embodiments the first chip includes active semiconductor devices while the second chip includes no semiconductor devices or only passive semiconductor devices.

Yet another embodiment of the present invention provides a method to form a 3D IC by bonding a first chip to a second chip, where the first chip includes a plurality of BMD particles having an equivalent diameter in the range of 70 nm to 130 nm and the second chip includes BMD, such BMD having equivalent diameter in the range of 20 nm to 50 nm.

BRIEF DESCRIPTION OF THE SEVERAL VIEWS OF THE DRAWINGS

FIGS. 1 illustrates a cross-sectional view of a 3D IC structure, according to one embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION OF THE INVENTION

As noted above, a significant number of TSVs which pass front side testing can exhibit unacceptable electrical leakage when tested after grinding or otherwise thinning the chip. The present inventors investigated these failures. Results of this investigation are presented in Table 1.

strates C and E are COP-free substrates whereas substrates B and D both include COPs. Several of each of the substrate types were processed to form TSVs and tested from the front side. About 25% of the TSVs formed in substrate A failed front side testing. In contrast, nearly 100% of TSVs formed in substrates B, C, D, or E passed front side testing.

Continued processing was performed with those TSVs of substrates A that passed front side testing and also the TSVs of substrate C. Back side electrical leakage testing was conducted after thinning these substrates to expose the TSV on the back side. Another roughly 25% of the substrate A TSVs failed backside testing after grinding to expose the TSV on the back side.

The unexpected finding was low TSV yield in substrate A, which consistent with a high temperature processing to create a denuded zone, had no COPs and a moderate BMD density of 5e8 to 4e9/cc, yet high TSV yield in wafers that contain COPs and have low BMD density such as substrate C.

Without wishing to be bound by theory, it appears that high BMD density formed according to a conventional high temperature anneal can lead to such latent TSV flaws. The inventors have discovered that TSV yield can be significantly improved by utilizing a substrate (e.g., FIG. 1: substrate 101) in which throughout the region traversed by a TSV (e.g., FIG 1: TSV 112), i.e., the '3D region' extending from the device layer (e.g., FIG. 1: device layer 109) on the front side (e.g., FIG. 1: front side 108) of a wafer to the back side (e.g., FIG. 1: back side 111) exposed after thinning, BMD density is within a narrow range of 1e4-1e7/cc and BMD size is less than 55 nm (size calculated as the diameter of a sphere having equal volume, i.e., equivalent diameter). In embodiments the 3D zone is a region that extends the length of a TSV 112 from a denuded zone 110 to the remote end (e.g., FIG. 1: end 116) of the TSV 112, which could be e.g., 20 to 100 um below the front side 108. In embodiments, about 85-90% of all BMD larger than 10 nm are between 25 and 35 nm. In embodiments, the substrate need not be free of COPs.

The substrate herein may comprise any conventional or future semiconductor wafer (or part thereof) with an epitaxial layer formed of, e.g., Si, SiGe, SiGeC, SiC, Ge alloys, GaAs, InAs, InP and other III/V or II/VI compound semiconductors. The substrate can optionally include a bulk material that may be the same or a different composition from the epitaxial layer, such as polycrystalline, amorphous, or single crystalline silicon, and the substrate can also optionally include an insulating layer which may be SiO2 or other insulating material under the epitaxial layer.

The TSVs described herein comprise a highly conductive core which may comprise e.g., copper, and also may comprise

TABLE 1

TSV Yield vs Substrate Type

| | Substrate type | | | | |
| --- | --- | --- | --- | --- | --- |
| | A (990) | B (582) | C (246) | D (217) | E (136) |
| COP-free? | denuded zone (10-30 um) | no | yes | no | yes |
| BMD density | 5e8-4e9/cc | ~6.6e6/cc | | | |
| BMD size | 60-~140 nm | 25-55 | | | |
| REI spikes | defects | No Defects | No Defects | No Defects | No Defects |
| Frontside yield | 70-75% | 100% | 100% | 100% | 100% |
| Backside yield | ~75 +/− 16% | | ~95 +/− 3% | | |

As shown in Table 1, substrate A has a denuded zone and BMD density consistent with a high temperature anneal. Subadditional layers such as a seed layer, SiO2 or other dielectric to provide electrical isolation, and one or more materials to prevent metal migration into the substrate. The conductive path of the TSV may extend with a nearly uniform diameter from the front surface to the grind side surface of a substrate, or such uniform diameter can extend also through a dielectric or passivation and into a BEOL layer, such that a cross section of the TSV is coplanar with one of the major surfaces of the substrate. This conductive path can be formed as a solid conduit which may, e.g., have a circular cross section, or it can be an annular conduit surrounding a nonconductive core.

As further depicted in FIG. 1, 3D ICs 100 described herein include a thinned chip 102 and at least one more semiconductor chip 104, 106 bonded together. The thinned chip may include one or more semiconductor devices on a front side. In embodiments, the thinned chip 102 can be e.g., an interposer having only passive semiconductor devices such as capacitors. In other embodiments the thinned chip 102 semiconductor devices can be active (e.g., field effect transistors) or can be a combination of active and passive semiconductor devices. In embodiments the at least one more semiconductor chip 104 can have a denuded zone 110 on the front side 108. For example the denuded zone 110 can be free of COP and BMD larger than 10 nm. The denuded zone 110 can extend several microns from the front side, such as to a depth of 10 um or even 25 or 30 um.

While the present invention has been described in terms of particular embodiments, the scope of the invention is not to be limited to the foregoing details but by the claims. It should be understood that an element claimed as being "on" or "over" another element can be directly on the other element or intervening elements may also be present, whereas when an element is claimed as being "directly on" or "directly over" another element, there are no intervening elements present. Similarly, elements claimed as being "connected" or "coupled" can be directly connected or coupled through intervening elements, whereas "directly connected" or "directly coupled" means no intervening elements are present.

What is claimed is:

1. A semiconductor chip including a semiconductor substrate, the semiconductor substrate comprising:
    a first major surface in which a semiconductor device has been formed,
    a second major surface opposite to said first major surface, said second major surface created by thinning said semiconductor substrate,
    a through-silicon-via (TSV) extending between the first and the second major surface, and
    bulk micro defects (BMD) having an average size less than 55 nm (nanometers) within a first region of said semiconductor substrate, said first region being within ten microns of said second major surface, said BMD having a density greater than 1e4/cc (particles per cubic centimeter) and less than 1e7/cc throughout a second region traversed by the TSV, said second region extending between the first and the second major surface.

2. The semiconductor chip of claim 1 further comprising: crystal originated defects in said region.

3. The semiconductor chip of claim 1 wherein:
    all of said BMD have an equivalent diameter less than or equal to 55 nm.

4. The semiconductor chip of claim 1 wherein:
    Said BMD have an average equivalent diameter in the range of 20 nm to 35 nm.

5. The semiconductor chip of claim 4 wherein
    said conductive path connects to a semiconductor device formed on a second chip, and
    said second chip is bonded to said semiconductor chip to form a 3D IC.

6. The semiconductor chip of claim 1 wherein at least one passive semiconductor device is formed in said first major surface.

7. An integrated circuit structure comprising,
    a first chip bonded to a second chip wherein
        said first chip includes a plurality of semiconductor devices,
        said second chip includes a front surface in which at least one semiconductor device is formed, a back surface opposite to said front surface, and a through substrate via (TSV) that extends at least from said front surface to said back surface, and
        said second chip includes BMD at a density between 1e4/cc and 1e7/cc in a region bounded by said back surface, the region traversed by the TSV and extending between said front surface and said back surface.

8. The integrated circuit structure of claim 7 wherein said region includes all of said second chip except a denuded zone.

9. The integrated circuit structure of claim 7 wherein said region includes the entirety of said second chip between said front surface and said back surface.

10. The integrated circuit structure of claim 7 wherein
    said first substrate includes a region in which BMD density is greater than 1e9/cc.

11. A 3D integrated circuit comprising:
    a first chip bonded to a second chip wherein
        said first chip includes first BMD in an interior region, such first BMD having an
        average equivalent diameter greater than 70 nm, and
        said second chip includes second BMD having average equivalent diameter smaller than 50 nm, a through-silicon-via (TSV) extending throughout the second chip, said second BMD having a density greater than 1e4/cc (particles per cubic centimeter) and less than 1e7/cc throughout a region traversed by the TSV, said region extending between a front side and a back side of the second chip.

12. The 3D integrated circuit of claim 11 further comprising
    a third chip, wherein said third chip has an average BMD size in the range of 20 nm to 50 nm.

13. The 3D integrated circuit of claim 11 wherein said second chip includes a second chip substrate which second chip substrate has a thickness between 20 and 100 um (microns).

14. The 3D integrated circuit of claim 11 wherein said first chip includes a plurality of active semiconductor devices formed on a device side of said first chip, and said second chip includes a front side on which a plurality of second semiconductor devices is formed and a grind side opposite to said front side, wherein
    said plurality of second semiconductor devices include active and passive semiconductor devices.

15. The 3D integrated circuit of claim 14 wherein said second chip includes a denuded zone in which said plurality of second semiconductor devices is formed.

* * * * *